United States Patent
Dalmatov

(10) Patent No.: US 11,513,692 B2
(45) Date of Patent: Nov. 29, 2022

(54) ARRANGING SSD RESOURCES BASED ON ESTIMATED ENDURANCE

(71) Applicant: EMC IP Holding Company LLC, Hopkinton, MA (US)

(72) Inventor: Nickolay Alexandrovich Dalmatov, Saint Petersburg (RU)

(73) Assignee: EMC IP Holding Company LLC, Hopkinton, MA (US)

( * ) Notice: Subject to any disclaimer, the term of this patent is extended or adjusted under 35 U.S.C. 154(b) by 0 days.

(21) Appl. No.: 15/523,062

(22) PCT Filed: Jun. 30, 2016

(86) PCT No.: PCT/RU2016/000406
§ 371 (c)(1),
(2) Date: Apr. 28, 2017

(87) PCT Pub. No.: WO2018/004368
PCT Pub. Date: Jan. 4, 2018

(65) Prior Publication Data
US 2018/0284997 A1    Oct. 4, 2018

(51) Int. Cl.
*G06F 3/06* (2006.01)
*G11C 29/00* (2006.01)
*G11C 16/34* (2006.01)
*G06F 11/10* (2006.01)
*G11C 29/04* (2006.01)

(52) U.S. Cl.
CPC .......... *G06F 3/0616* (2013.01); *G06F 3/0631* (2013.01); *G06F 3/0647* (2013.01); *G06F 3/0688* (2013.01); *G06F 11/1076* (2013.01); *G11C 16/349* (2013.01); *G11C 29/00* (2013.01); *G11C 2029/0409* (2013.01)

(58) Field of Classification Search
CPC ........ G06F 3/06; G06F 3/0616; G06F 3/0631; G06F 3/0647; G06F 3/0688; G06F 11/1076; G11C 2029/0409; G11C 16/349; G11C 29/00
USPC .................................................. 711/103, 102
See application file for complete search history.

(56) References Cited

U.S. PATENT DOCUMENTS

| | | | |
|---|---|---|---|
| 8,627,181 B1 | 1/2014 | Ito | |
| 9,037,795 B1 | 5/2015 | Linnell et al. | |
| 9,183,137 B2 * | 11/2015 | Schmier | G06F 3/0616 |
| 9,256,381 B1 | 2/2016 | Fultz et al. | |
| 9,619,181 B2 * | 4/2017 | Ono | G06F 3/0688 |
| 9,639,282 B2 * | 5/2017 | Kankani | G06F 3/0616 |

(Continued)

FOREIGN PATENT DOCUMENTS

RU            123552 U1    12/2012

*Primary Examiner* — David Yi
*Assistant Examiner* — Zubair Ahmed
(74) *Attorney, Agent, or Firm* — BainwoodHuang

(57) ABSTRACT

A technique for managing SSDs in a data storage system generates an endurance value for each of multiple SSDs and arranges the SSDs in RAID groups based at least in part on the generated endurance values. As a result of such arranging, some RAID groups may include only SSDs with higher endurance values while other RAID groups may include only SSDs with lower endurance values. The data storage system may then run RAID groups with higher endurance values at higher speeds and may run RAID groups with lower endurance values at lower speeds.

25 Claims, 4 Drawing Sheets

(56) References Cited

U.S. PATENT DOCUMENTS

| | | |
|---|---|---|
| 2014/0325262 A1 | 10/2014 | Cooper et al. |
| 2015/0106556 A1* | 4/2015 | Yu ........................ G11C 16/349 |
| | | 711/103 |
| 2015/0199152 A1* | 7/2015 | Asnaashari ......... G06F 11/1076 |
| | | 711/103 |
| 2016/0188424 A1 | 6/2016 | Walls |
| 2016/0292025 A1* | 10/2016 | Gupta ................... G06F 3/0688 |
| 2017/0024276 A1* | 1/2017 | Kanno ................ G06F 11/1008 |
| 2017/0097784 A1* | 4/2017 | Iida ....................... G06F 3/0619 |
| 2017/0147237 A1* | 5/2017 | Fang ..................... G06F 3/0616 |
| 2017/0180599 A1* | 6/2017 | Nitta ..................... G06F 3/0608 |
| 2017/0262231 A1* | 9/2017 | Koishi .................. G06F 3/0616 |
| 2018/0067687 A1* | 3/2018 | Nakamura .............. G06F 3/061 |

* cited by examiner

ARRANGING SSD RESOURCES BASED ON ESTIMATED ENDURANCE

BACKGROUND

Data storage systems are arrangements of hardware and software that include one or more storage processors coupled to arrays of non-volatile storage devices, such as magnetic disk drives, electronic flash drives, and/or optical drives, for example. The storage processors service storage requests, arriving from host machines ("hosts"), which specify files or other data elements to be written, read, created, or deleted, for example. Software running on the storage processors manages incoming storage requests and performs various data processing tasks to organize and secure the data elements stored on the non-volatile storage devices.

Data storage systems commonly arrange storage devices in RAID Groups. "RAID" is an acronym for Redundant Array of Independent (or Inexpensive) disks. Many RAID configurations have been developed, which involve striping, mirroring, and/or parity. For example, RAID 0 provides striping but no mirroring or parity, RAID 1 provides mirroring across two or more disks, RAID 4 provides dedicated parity, and RAID 5 and RAID 6 provide distributed parity (single parity for RAID 5 and double parity for RAID 6). RAID configurations that provide parity allow any disk drive to fail without data loss, as the failed disk drive may be rebuilt from the contents of the remaining disk drives, e.g., by computing an exclusive-OR of their corresponding contents.

RAID groups may consist of magnetic disk drives, solid state drives (SSDs), or any other type of disk drive. For performance reasons, each RAID group generally includes disk drives of like kind, as the speed of the RAID group as a whole is typically limited by the speed of its slowest disk drive.

SUMMARY

SSDs offer many advantages over conventional magnetic disk drives, particularly in terms of access speeds. However, SSDs have intrinsic properties that cause them to wear out, as the process of writing to an SSD may cause microscopic damage that accumulates over many write cycles.

SSDs in a RAID group tend to be written-to at a uniform rate. For instance, in a RAID 1 (mirroring) configuration, a write to one SSD is accompanied by a write of the same size to another SSD. Other RAID configurations similarly tend to balance writes across their constituent drives. Unfortunately, not all SSDs in a RAID group can reliably handle the rate at which the SSDs are written. For example, one SSD may fail much sooner than others, on account of its being more susceptible to accumulated damage. To promote reliability, a data storage system may operate SSDs in its RAID groups at less than their maximum speeds. However, doing so underutilizes storage resources, as many or most SSDs may be capable of running faster without suffering premature failure.

In contrast with prior approaches, which may underutilize SSDs, an improved technique for managing SSDs in a data storage system generates an endurance value for each of multiple SSDs and arranges the SSDs in RAID groups based at least in part on the generated endurance values. As a result of such arranging, some RAID groups may include only SSDs with higher endurance values while other RAID groups may include only SSDs with lower endurance values. The data storage system may then run RAID groups with higher endurance values at higher speeds and may run RAID groups with lower endurance values at lower speeds.

Advantageously, the improved technique better utilizes SSD resources overall, e.g., by running higher-endurance SSDs faster while running lower-endurance SSDs slower, allowing SSDs of all endurance values to meet their desired lifespans and without slowing down the higher endurance SSDs to accommodate the lower endurance ones.

In some examples, the improved technique generates endurance values based on monitoring actual performance of the SSDs or of SSDs of like kind (e.g., the same manufacturer and/or model number). Thus, endurance values may be estimates based on actual measurements. Sometimes, manufacturers provide endurance specifications. However, it has been recognized that such specifications tend to be overly conservative. Thus, providing estimates of endurance based on measurements tends to produce more accurate values, which serve as a more accurate basis for arranging SSDs in RAID groups.

Certain embodiments are directed to a method of managing SSDs (Solid State Drives) in a data storage system. The method Includes generating an endurance value for each of multiple SSDs in a RAID (Redundant Array of Independent Disks) group, each endurance value for an SSD indicating an estimated number of write operations that may be performed on the SSD before the SSD wears out and requires replacement. In response to detecting that a first SSD in the RAID group has an endurance value that differs from that of a set of other SSDs in the RAID group, the method further includes modifying the RAID group by (i) replacing the first SSD with a second SSD not previously part of the RAID group, based at least in part on the second SSD having an endurance value that matches that of the set of other SSDs more closely than that of the first SSD, and (ii) populating the second SSD with contents of the first SSD to enable the RAID group to operate with the second SSD in place of the first SSD.

Other embodiments are directed to a data storage system constructed and arranged to perform a method of managing SSDs (Solid State Drives) in a data storage system, such as the method described above. Still other embodiments are directed to a computer program product. The computer program product stores instructions which, when executed on control circuitry of a data storage system, cause the data storage system to perform a method of managing SSDs (Solid State Drives), such as the method described above. Some embodiments involve activity that is performed at a single location, while other embodiments involve activity that is distributed over a computerized environment (e.g., over a network).

The foregoing summary is presented for illustrative purposes to assist the reader in readily understanding example features presented herein and is not intended to set forth required elements or to limit embodiments hereof in any way.

BRIEF DESCRIPTION OF THE SEVERAL VIEWS OF THE DRAWINGS

The foregoing and other features and advantages will be apparent from the following description of particular embodiments of the invention, as illustrated in the accompanying drawings, in which like reference characters refer to the same or similar parts throughout the different views. The drawings are not necessarily to scale, emphasis instead being placed upon illustrating the principles of various embodiments of the invention. In the accompanying drawings.

DETAILED DESCRIPTION OF THE INVENTION

Embodiments of the invention will now be described. It is understood that such embodiments are provided by way of example to illustrate various features and principles of the invention, and that the invention hereof is broader than the specific example embodiments disclosed.

An improved technique for managing SSDs in a data storage system generates an endurance value for each of multiple SSDs and arranges the SSDs in RAID groups based at least in part on the generated endurance values. The data storage system may then run RAID groups with higher endurance values at higher speeds and may run RAID groups with lower endurance values at lower speeds.

Figure 1:
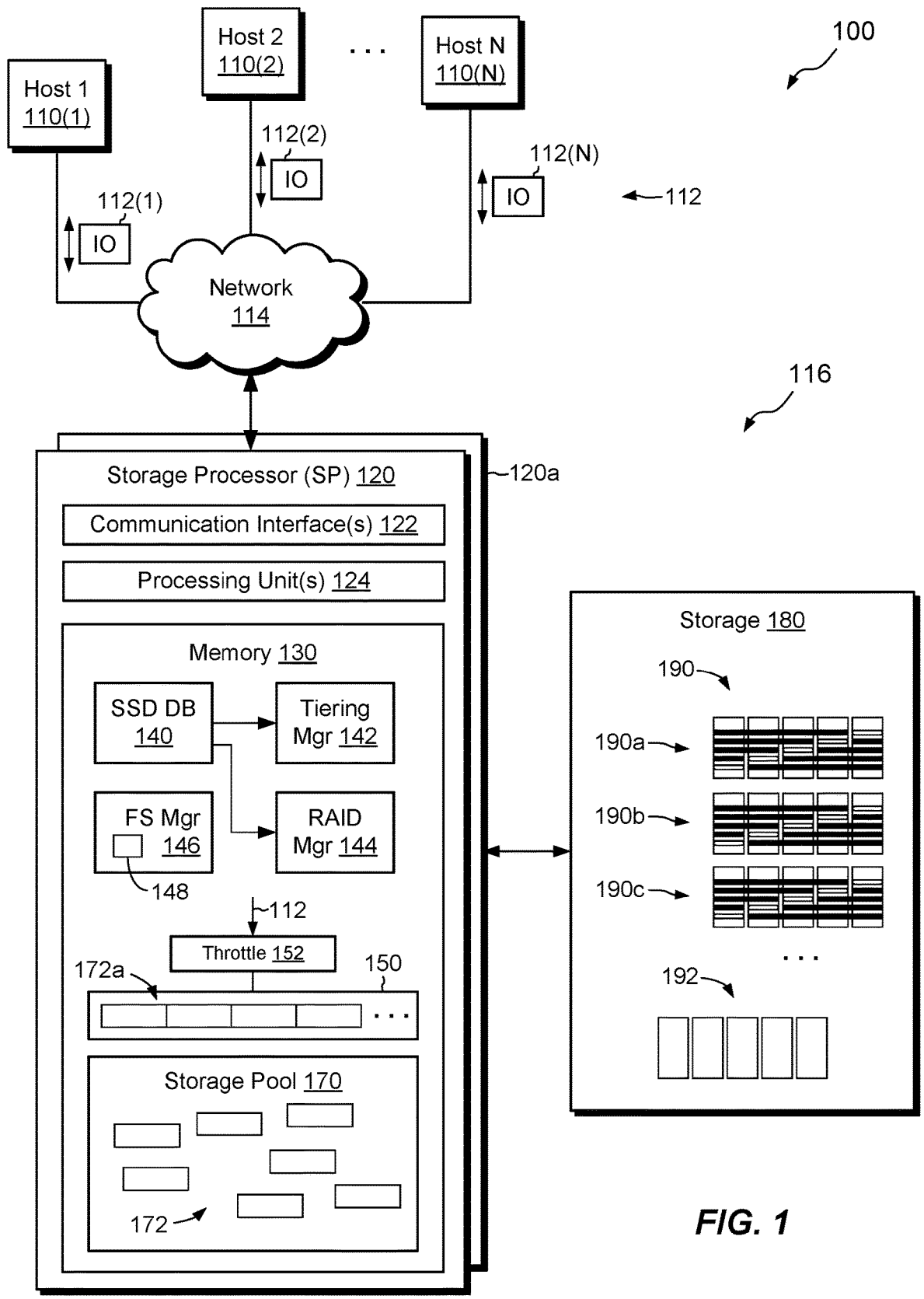
FIG. 1 is a block diagram showing an example environment in which embodiments of the improved technique hereof can be practiced.

FIG. 1 shows an example environment 100 in which embodiments of the improved technique hereof can be practiced. Here, host computing devices ("hosts") 110(1) through 110(N) access a data storage system 116 over a network 114. The data storage system 116 includes a storage processor, or "SP," 120 and storage 180. The storage 180 includes, for example, solid state drives (SSDs), magnetic disk drives, and/or optical drives and the like, which are arranged in RAID groups 190. Three RAID groups, 190a, 190b, and 190c, are shown. Disk drives that make up each RAID group 190 are generally of the same type and provide similar levels of performance. The storage 180 also includes spare disk drives 192. Some of these spare disk drives 192 may be "hot spares," meaning that they are maintained in a powered-up state and are ready to be deployed quickly if the need arises, e.g., if a disk drive in one of the RAID groups 190 should fail. Although each of the RAID groups 190 is seen to include five disk drives, this is merely an example, as RAID groups 190 may each include any number of disk drives greater than one and may be arranged in any RAID configuration that provides striping, mirroring, and/or parity. Also, as used herein, the terms "disk drive," "disk," and "drive" are intended to apply to storage drives of any type or technology, and thus describe magnetic disk drives, optical disk drives, SSDs, flash drives, and the like, even if such drives have no identifiable "disk."

The SP 120 is seen to include one or more communication interfaces 122, a set of processing units 124, and memory 130. The communication interfaces 122 include, for example, SCSI target adapters and network interface adapters, for converting electronic and/or optical signals received over the network 114 to electronic form for use by the SP 120. The set of processing units 124 includes one or more processing chips and/or assemblies. In a particular example, the set of processing units 124 includes numerous multi-core CPUs and associated co-processors and chipsets. The memory 130 includes both volatile memory (e.g., RAM), and non-volatile memory, such as one or more ROMs, disk drives, solid state drives, and the like. The set of processing units 124 and the memory 130 together form control circuitry, which is constructed and arranged to carry out various methods and functions as described herein. Also, the memory 130 includes a variety of software constructs realized in the form of executable instructions. When the executable instructions are run by the set of processing units 124, the set of processing units 124 are caused to carry out the operations defined by the software constructs. Although certain software constructs are specifically shown and described, it is understood that the memory 130 typically includes many other software constructs, which are not shown, such as an operating system, various applications, processes, and daemons.

The memory 130 is seen to "include," i.e., to realize by execution of software instructions, a file system 150 and a storage pool 170. The storage pool 170 includes multiple extents 172, which provide units of storage that may be provisioned to file system 150. File system 150 is seen to include numerous provisioned extents 172a. In an example, each extent 172 (or 172a) is derived from a single RAID group (e.g., 190a, 190b, or 190c), and different extents 172 in the pool 170 may be derived from different ones of the RAID groups 190. In some examples, each extent 172 is a relatively large increment of storage space, such as 256 MB or 1 GB in size.

The memory 130 is further seen to include an SSD database 140, a tiering manager 142, a RAID manager 144, and a file system manager 146. The SSD database 140 stores information about SSDs in the storage 180, e.g., in RAID groups 190 and in spares 192. This information may include estimated endurance values and, in some cases, performance data, such as accumulated errors, chip failures, and corresponding numbers of P/E (program/erase) cycles and times.

The tiering manager 142 performs storage tiering of data in the storage 180. In an example, different ones of the RAID groups 190 are arranged in respective storage tiers, with each storage tier providing a respective service level. For example, one storage tier may be derived from SSDs and another from magnetic disk drives. Multiple SSD tiers and/or magnetic disk drive tiers may be provided. In an example, the tiering manager 142 monitors activity on a per-extent 172a basis and automatically moves data between storage tiers, based on monitored activity. For example, if the data storage system 116 directs many reads and/or writes to a storage extent 172a derived from a magnetic tier, the tiering manager 142 may move the data from that extent 172a to an SSD tier, so that the data storage system 116 can operate more efficiently. Likewise, if the data storage system 116 rarely reads or writes data on an extent 172a derived from an SSD tier, the tiering manager 142 may move that rarely accessed data to a magnetic tier, as the space on the SSD tier could be more efficiently used by more frequently accessed data.

The RAID manager 144 organizes and maintains RAID groups 190. For example, the RAID manager 144 creates RAID groups 190, swaps in spare drives 192 when disk drives in RAID groups fail, and rebuilds data on disk drives newly added to existing RAID groups.

The file system manager 146 controls operations of the file system 150. In an example, the file system manager 146 includes performance data 148, which may provide, for example, numbers of writes to provisioned extents 172, amounts of data written, and times when those writes occurred. In an example, the file system manager 146 provides the performance data 148 to the tiering manager 142, which applies the performance data in performing automatic tiering of provisioned extents 172a.

In example operation, the hosts 110(1-N) issue IO requests 112(1-N) to the data storage system 116. The SP 120 receives the IO requests 112(1-N) at the communication interfaces 122 and initiates further processing. Such processing may include performing reads and writes to provisioned extents 172a in the file system 150. As the reads and writes proceed, the file system manager 146 accumulates new performance data pertaining to provisioned extents 172a. Also, the SSD database 142 accumulates new performance data pertaining to SSDs in the storage 180.

At some point during operation, SP 120 may generate estimates of endurance for some of all SSDs in the storage 180. For example, SP 120 may generate estimates from the accumulated performance data in the SSD database 140. In some cases, the SSD database 140 may already include endurance estimates for some SSDs, which may have been provided when the SSDs were first installed, for example. In some cases, the SP 120 may overwrite prior endurance estimates with new estimates, e.g., based on newly acquired performance data.

In an example, the RAID manager 144 receives the endurance estimates from the SSD database 140 and checks the RAID groups 190 for uniformity in those endurance estimates. For RAID groups lacking uniformity in endurance estimates, the RAID manager 144 may take action to promote uniformity, e.g., by replacing any SSDs that have outlying endurance estimates with SSDs that have endurance estimates that more closely match those of other SSDs in the respective RAID groups. Replacing SSDs may entail swapping out an outlying SSD in a RAID group for a spare SSD. It may also entail exchanging an SSD in one RAID group for an SSD in another RAID group. Whenever the RAID manager 142 adds a new SSD to a RAID group in place of an old SSD, the RAID manager 142 rebuilds the RAID group such that the new SSD is made to store the same data that the old SSD stored.

Rebalancing RAID groups based on endurance estimates promotes uniformity in endurance within RAID groups, such that each RAID group can operate at or near the endurance limit of each of its constituent SSDs. For example, the data storage system 116 can operate RAID groups with uniformly high-endurance SSDs in a manner consistent with high endurance, i.e., at high write frequency. Conversely, the data storage system 116 can operate RAID groups with uniformly lower-endurance SSDs in a manner consistent with the lower endurance, i.e., at a lower write frequency. The high and low endurance SSDs are each utilized closer to their potential. Lower endurance SSDs do not drag down the write frequency of higher endurance SSDs, nor do higher endurance SSDs cause lower-endurance SSDs to prematurely fail.

In some examples, the data storage system 116 can apply throttle 152 to slow the arrival of IO requests 112 to the file system 150. For example, if an IO request 112 is directed to a provisioned extent 172a that is backed by a RAID group whose SSDs have low endurance estimates, the throttle 152 can delay the progress of the IO request 112 to enforce a minimum time delay between successive IO requests 112 directed to that extent. The effect of delaying IO requests 112 is to reduce write frequency of the provisioned extent, and therefore to its underlying RAID group. By selectively applying the throttle 152, the data storage system 116 can operate the SSDs in a RAID group in a manner that enables them to last for their desired lifespans.

Figures 2, 3:
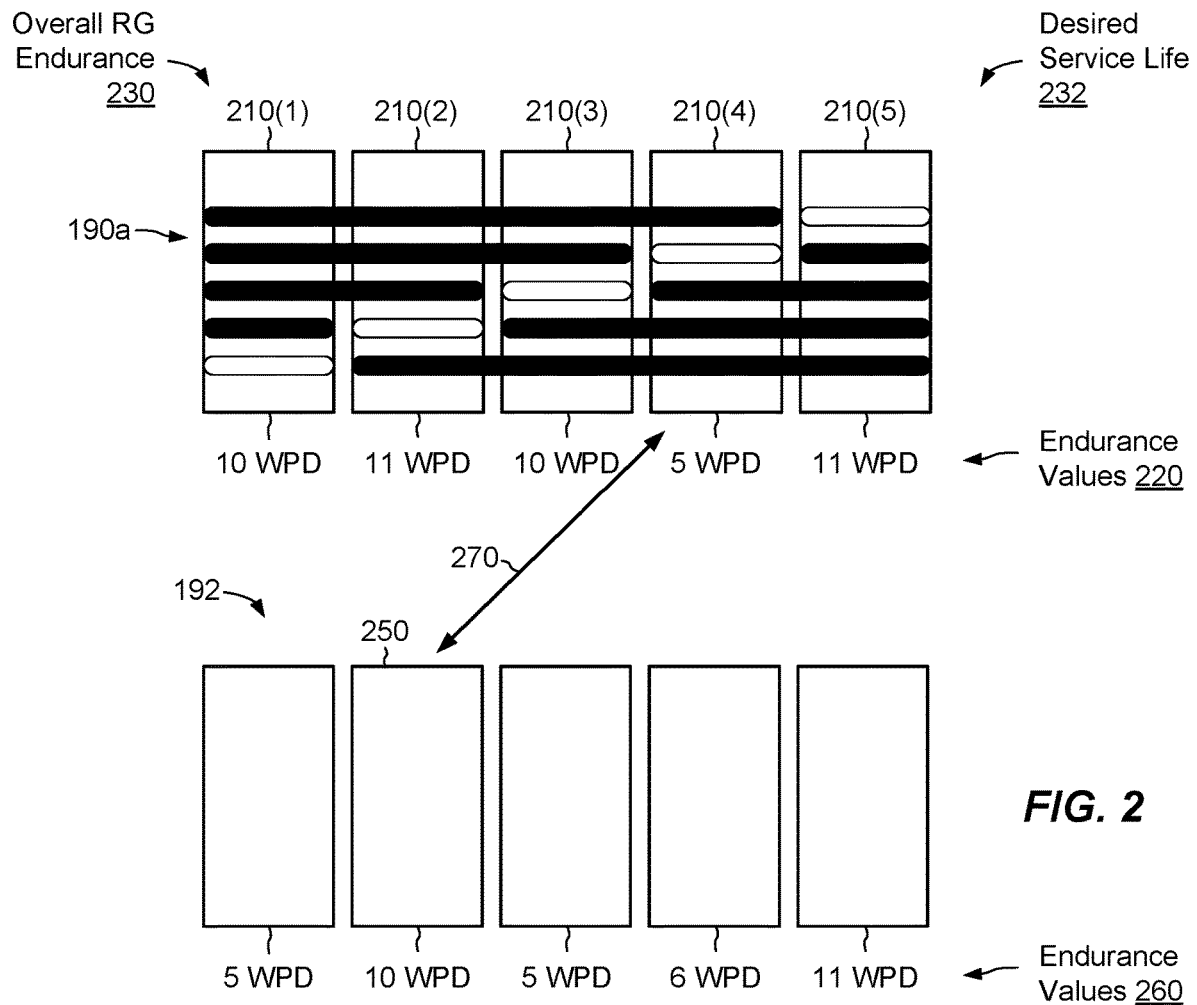
FIG. 2 is a block diagram of an example RAID group and example spare drives of FIG. 1.
FIG. 3 is a block diagram of an example SSD database of FIG. 1.

FIG. 2 shows the RAID group 190a of FIG. 1 in additional detail. The RAID group 190a is seen to include SSDs 210(1) to 210(5). The SSDs 210(1-5) are arranged in a RAID 5 configuration (single distributed parity); however, this is merely an example, as the technique may be used in any RAID configuration and with as few as two SSDs.

Each of the SSDs 210(1-5) has a respective estimated endurance value. Endurance values 220 may have been generated recently in response to monitored performance data, for example, or may have been established at the time of installation. As used herein, endurance values 220 are expressed in units of writes per day (WPD). Each unit of WPD describes a write of the entire contents of the SSD and is calculated based on a predetermined desired service life 232, such as 5 years. For example, if a 1 TB (terabyte) SSD has an endurance value of 10 WPD, the entire 1 TB of the SSD may be rewritten 10 times every day for 5 years before the SSD is expected to wear out and require replacement. In some examples, WPD is expressed more formally as a quotient of (i) the total number of P/E (Program/Erase) cycles that an SSD experiences before it is expected to require replacement, and (ii) the number of days in its desired lifespan.

Here, SSDs 210(1) and 210(3) have estimated endurance values of 10 WPD, SSDs 210(2) and 210(5) have estimated endurance values of 11 WPD, and SSD 210(4)) has an estimated endurance value of 5 WPD. It can be seen that SSD 210(4) is an outlier, as its endurance value is significantly lower than those of the other SSDs 210(1-3 and 5).

The outlier status of SSD 210(4) may have two consequences, both of which are undesirable. First, the lower endurance of SSD 210(4) may cause the RAID group 190a to prematurely fail, e.g., if the data storage system 116 operates the RAID group 190a at an average WPD consistent with the endurance of the other SSDs 210(1-3 and 5). Second, the lower endurance of SSD 210(4) may cause the data storage system 116 to operate the RAID group 190a more slowly than it would if the endurance values of the SSDs 210(1-5) were all uniformly high. In an example, the RAID group 190a may be regarded as having an overall endurance value 230, which may be calculated as the minimum of the endurance values 220 across all SSDs 210(1-5). To operate the RAID group 190a more slowly, the data storage system 116 might apply throttle 152 (FIG. 1) to IO requests 112, thus reducing average write frequency to a value consistent with the overall endurance 230 of the RAID group 190a.

To avoid these undesirable consequences, the RAID manager 144 may check whether a compatible SSD may be found among the spare drives 192. Any such compatible SSD will preferably have storage capacity and access speed similar to those of SSDs 210(1-3 and 5). It will also have an estimated WPD that more closely matches those of SSDs 210(1-3 and 5) than does SSD 210(4). Here, the RAID manager 144 is able to find SSD 250, which has an endurance value 260 of 10 WPD. This endurance value is similar to those of SSDs 210(1-3 and 5). In an example, SSD 250 is a hot spare that is also compatible with SSDs 210(1-3 and 5) in terms of capacity and speed.

RAID manager 144 may then take actions to replace SSD 210(4) with spare SSD 250 (arrow 270). For example, RAID manager 144 may remove SSD 210(4) from the RAID group 190a and add SSD 250 to the RAID group 190a in its place. As the data storage system 116 may house SSDs in an electronic chassis, replacing SSD 210(4) with SSD 250 may involve a logical change rather than a physical change. For example, replacement may involve updating metadata that defines membership of RAID group 190*a* using SSD identifiers or addresses along a backplane.

RAID manager 144 may then populate SSD 250 with the contents of SSD 210(4). For example, RAID manager 144 may copy the contents of SSD 210(4), sector-by-sector, to SSD 250. Alternatively, RAID manager 144 may treat SSD 210(4) as a failed drive and treat SSD 250 as its replacement, rebuilding the contents of SSD 210(4) onto SSD 250 using conventional RAID protocols. Although it is not required that SSD 250 be a hot spare, providing SSD 250 as a hot spare may help to facilitate replacement of SSDs quickly and with less (if any) disruption to hosts 110(1-N).

Once SSD 250 is in place, the overall endurance 230 of the RAID group 190*a* increases from 5 WPD to 10 WPD, and the RAID group 190*a* can begin operating at the higher write frequency. Thus, any delays introduced by throttle 152 can be reduced or eliminated. The RAID group 190*a* is thus able to utilize the SSDs 210(1-3, and 5) more fully, without sacrificing the service life 232 of the RAID group 190*a*. Meanwhile, the SSD 210(4) may become a new hot spare, which is available to replace any failed drive in any of the RAID groups 190.

Although the outlier 210(4) in RAID group 190*a* has a lower endurance than the other SSDs in that RAID group, one could also use the above technique for outliers that have higher endurance values. In that situation, the outlier with the higher endurance value may be underutilized, such that the data storage system 116 might perform better overall if it were to include that SSD in a RAID group whose members have higher endurance.

Also, although the examples above assume that an outlier SSD is replaced with a spare 192, this is not required. For example, the RAID manager 144 may swap SSDs between or among any of the RAID groups 190 to better balance the endurance values of SSDs within each affected RAID group. Although the examples above show replacement of a single SSD in a RAID group, the technique may also be applied for replacing multiple SSDs.

Further, it should be appreciated that endurance values 220 of SSDs may change over time, and that endurance values of different SSDs may change at different rates. For example, after a period of time passes, such as 1 year, the SP 120 may regenerate endurance values 220, e.g., based on performance data accumulated over the prior year and/or based on other information. If any outlier SSD is detected among the newly-generated endurance values, the RAID manager 144 may swap out the new outlier for a spare or other SSD, whose endurance value more closely matches those of the other SSDs in the RAID group.

FIG. 3 shows an example arrangement of the SSD database 140. The particular arrangement of the SSD database 140 in FIG. 3 is intended to be simplified and illustrative rather than limiting. In the example shown, the SSD database 140 includes the following information, for each SSD in the storage 180:

SSD ID: An identifier of the SSD which allows the SSD to be identified uniquely within the data storage system 116.

Manufacturer Spec: A manufacturer's specification, if any, for endurance of the SSD. This specification is often overly conservative.

Endurance Value: An estimated endurance value, generated for example by the manufacturer of the data storage system 116, which typically provides a more accurate measure of endurance than does the manufacturer's specification.

P/E: An accumulated total number of P/E (Program/Erase) cycles experienced by the SSD. In some examples, the SSD database 140 includes multiple values of this number for the SSD, with such values accumulated over time and provided with associated timestamps that mark the dates and/or times at which the numbers were obtained. Values of this number may be tracked by the data storage system 116 (e.g., by the RAID manager 144 and/or the file system manager 246) and/or by the SSD itself.

Errors: An accumulated number of errors that have occurred in the SSD. In an example, these errors are internal, recoverable errors that do not result in data loss to the user. In some examples, the SSD database 140 includes multiple values of this number for the SSD, with such values accumulated over time and provided with associated timestamps that mark the dates and/or times at which the numbers were obtained. Values of this number may be tracked by the SSD itself. In some examples, this field also includes the number of failed chips in the SSD and corresponding timestamps indicating dates and/or times of failure.

Certain makes and models of SSDs provide access to diagnostic information concerning performance and particular types of errors that have occurred. In some examples, the SSD database 140 may include such diagnostic information and the SP 120 may apply this information in generating estimated endurance values.

In some examples, SP 120 generates endurance values based on accumulated performance data of SSDs as they operate in the data storage system 116. This is not required, however. For example, endurance values may be generated by other means, such as by laboratory analysis and characterization of certain makes, models, and/or manufacturing runs of SSDs, by using sample testing and/or stress testing, and/or based on actual failure data of SSDs in the field.

Figure 4:
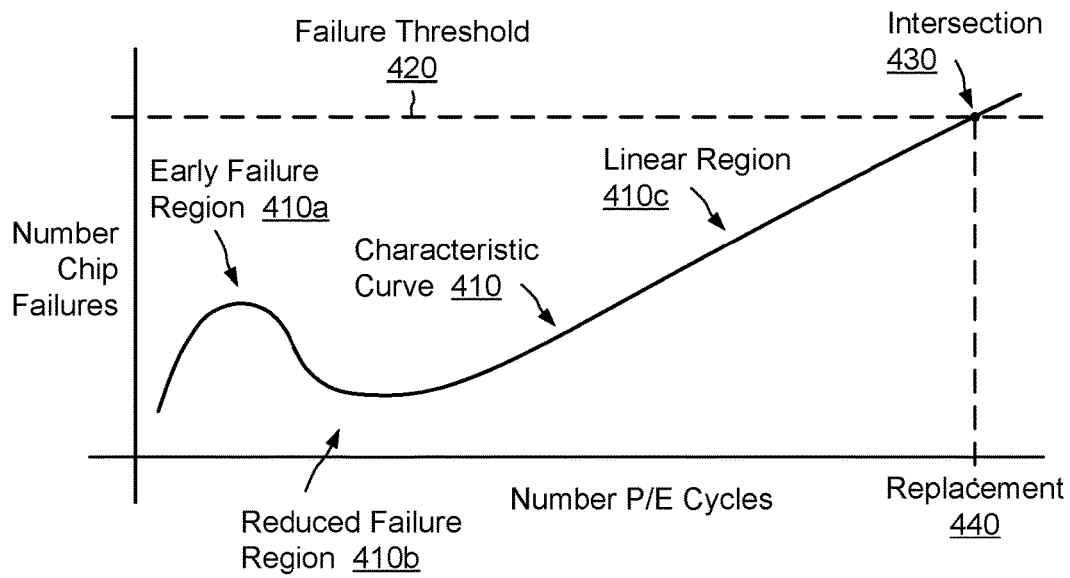
FIG. 4 is a graph showing an example arrangement for predicting a number of P/E (Program/Erase) cycles at which an SSD will require replacement.

FIG. 4 shows one example arrangement for generating endurance values of SSDs. Here, observation and/or laboratory testing of SSDs reveals that numbers of chip failures within SSDs varies as a function of numbers of P/E cycles, and that the pattern of failures tends to follow a characteristic failure curve 410. The curve 410 may include an early failure region 410*a*, where chip failures may occur due to manufacturing defects, followed by a reduced failure region 410*b*, followed by a gradual linear region 410*c*, during which chip failures increase slowly. An error threshold 420 defines a number of failures at which an SSD is declared failed and in need of replacement. Knowing the curve 410 and the failure threshold 420, one may predict an intersection 430 of the two, which corresponds to a number 440 of P/E cycles at which failure of an SSD is predicted and by which point replacement of the SSD should occur. In an example, the endurance value of an SSD is predicted based on the replacement number 440, e.g., by converting a number of P/E cycles to a corresponding number of writes per day.

Although different types of SSDs may follow the characteristic curve 410, aspects of the curves for different SSD types may vary. For example, the linear region 410*c* may have different slopes for different SSD types. By tracking numbers of failed SSD chips and corresponding numbers of P/E cycles at multiple times, however, one may estimate the slope of the linear region 410*c* for a particular SSD type and thereby predict the intersection point 430 and the replacement number 440. In this manner, endurance estimates may be generated based on replacement numbers 440, e.g., by setting the estimates equal to (or perhaps slightly less than) a number of WPD that corresponds to the number of P/E cycles in the number 440.

Figure 5:
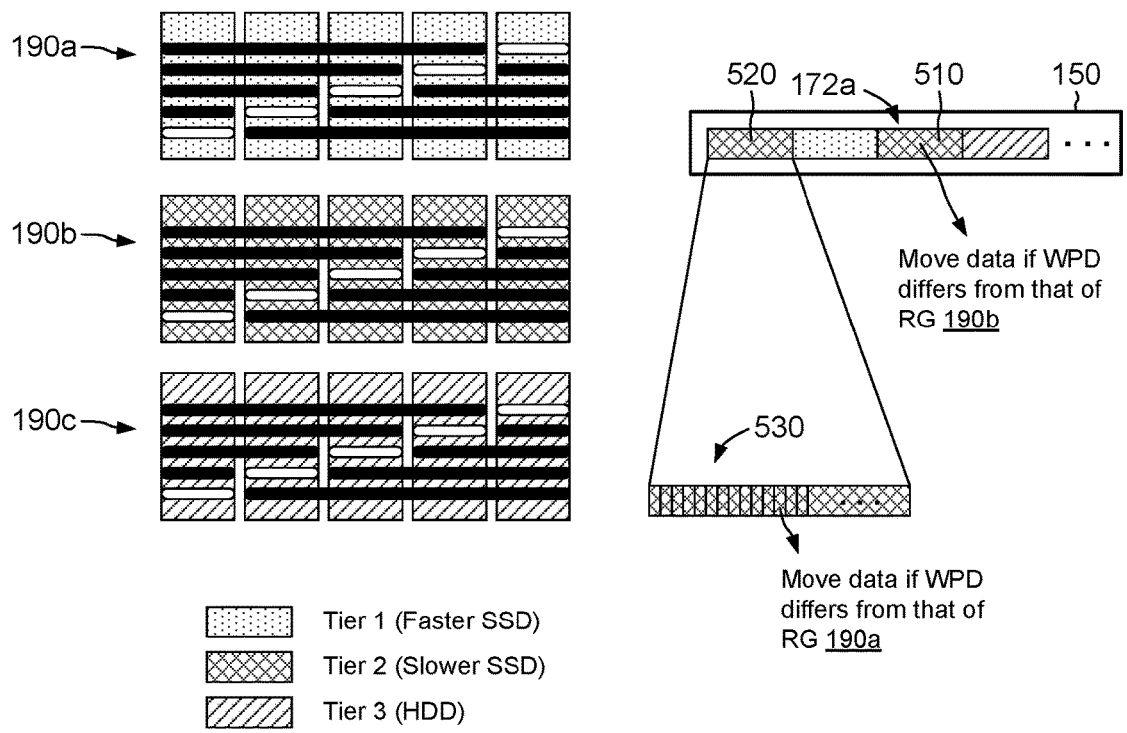
FIG. 5 is a block diagram of RAID groups in different storage tiers and of an arrangement for moving data between storage tiers based on write frequency.

FIG. 5 shows an example arrangement for applying SSD endurance estimates in an environment that supports storage tiering. As is known, "storage tiering" is a technique for optimizing storage utilization in a data storage system, e.g., by placing frequently-accessed data on faster storage media, such as SSD, and by placing less frequently-accessed data on slower storage media, such as magnetic disk drives. The RAID groups 190 in the storage 180 each belong to one storage tier, which may be assigned based on the performance characteristics of the drives of which they are composed.

In the example of FIG. 5, RAID group 190a is assigned to Tier 1 (faster SSD), RAID group 190b is assigned to Tier 2 (slower SSD), and RAID group 190c is assigned to Tier 3 (Magnetic HDD). As shown to the right, each provisioned extent 172a in file system 150 is derived from one and only one of these RAID groups 190a-c. Different provisioned extents 172a may be derived from different RAID groups. The file system manager 146 (FIG. 1) may monitor a "data temperature" of each provisioned extent 172a, which indicates a measure of read and/or write activity directed to the respective extent 172a. The tiering manager 142 (FIG. 1) may then make tiering decisions automatically, e.g., by moving "hotter" extents 172a to Tier 1 and by moving "colder" extents 172a to Tier 3.

In accordance with further improvements hereof, the tiering manager 144 further considers write frequencies of extents 172a when making tiering decisions. For example, file system manager 146 may store performance data 148 that indicates average write frequency, e.g., in WPD, of each provisioned extent 172a. The tiering manager 144 may receive this information and compare the WPD of each extent 172a with the endurance 230 of the RAID group from which the extent 172a is derived. If there is a discrepancy, the tiering manager 144 may move the contents of that extent to a different storage tier that has an endurance value more consistent with the write frequency of the contents of that extent.

For example, FIG. 5 shows a provisioned storage extent 510, which is derived from Tier 2 (RAID group 190b). If the write frequency of data for extent 510 is greater than endurance 230 of RAID group 190b as a whole, then the tiering manager 144 may move the data on extent 510 to a higher storage tier, e.g., to Tier 1 (RAID group 190a). Conversely, if the write frequency of data for extent 510 is less than endurance 230 of RAID group 190b as a whole, then the tiering manager 144 may move the data on extent 510 to a lower storage tier, e.g., to Tier 3 (RAID group 190c).

In some examples, the tiering manager 144 may operate at an even finer level of granularity. For example, the tiering manager 144 may receive performance data indicating write frequencies of sub-extents, such as blocks or other units of storage within an extent. Extent 520, which is derived from Tier 2 (RAID group 190b), includes multiple sub-extents 530. If the write frequency for any sub-extent 530 differs significantly from the endurance 230 of the RAID group 190b as a whole, the tiering manager 144 may move the contents of that sub-extent to a different storage tier.

It should be appreciated that tiering based on write frequency will often produce different results than would tiering based on data temperature. For example, data temperature may be based on reads as well as writes and, with regard to writes, is based on numbers of writes more than of the total volume of data written. In contrast, write frequency is based on the rate at which the total contents of an extent are written. Thus, an extent with a high data temperature may have a relatively low write frequency. Likewise, an extent with a low data temperature may have a relatively high write frequency.

In an example, the tiering manager 144 includes logic to assist with tiering decisions in case of conflicts between demands based on data temperature and demands based on write frequency. For example, the tiering manager 144 may give demands based on data temperature priority over demands based on write frequency, or vice-versa. In some examples, the tiering manager 144 may employ a scoring system, where scores may be computed as follows:

$$\text{Score}=W1*\Delta T+W2*\Delta WF.$$

Here, $\Delta T$ is the difference (positive or negative) between data temperature of an extent and data temperature for its storage tier as a whole and $\Delta WF$ is the difference (positive or negative) between write frequency of an extent and endurance 230 of its RAID group as a whole. W1 and W2 are weights applied to data temperature and write frequency, respectively. If the score exceeds a threshold in the positive direction, the tiering manager 144 may move the contents of the extent to a higher storage tier. Likewise, if the score exceeds a threshold in the negative direction, the tiering manager 144 may move the contents of the extent to a lower storage tier.

Although the storage tiering as shown in FIG. 5 is described in connection with file system 150, it should be appreciated that a file system is merely one type of data object to which the data storage system 116 may provision storage extents 172a from the pool 170. Other types of data objects may include, for example, volumes, LUNs (Logical UNits), virtual machine disks, and other types of data objects. Thus, embodiments of the improved techniques hereof are not limited to use with file systems but may be used with any data objects to which extents are provisioned.

Figure 6:
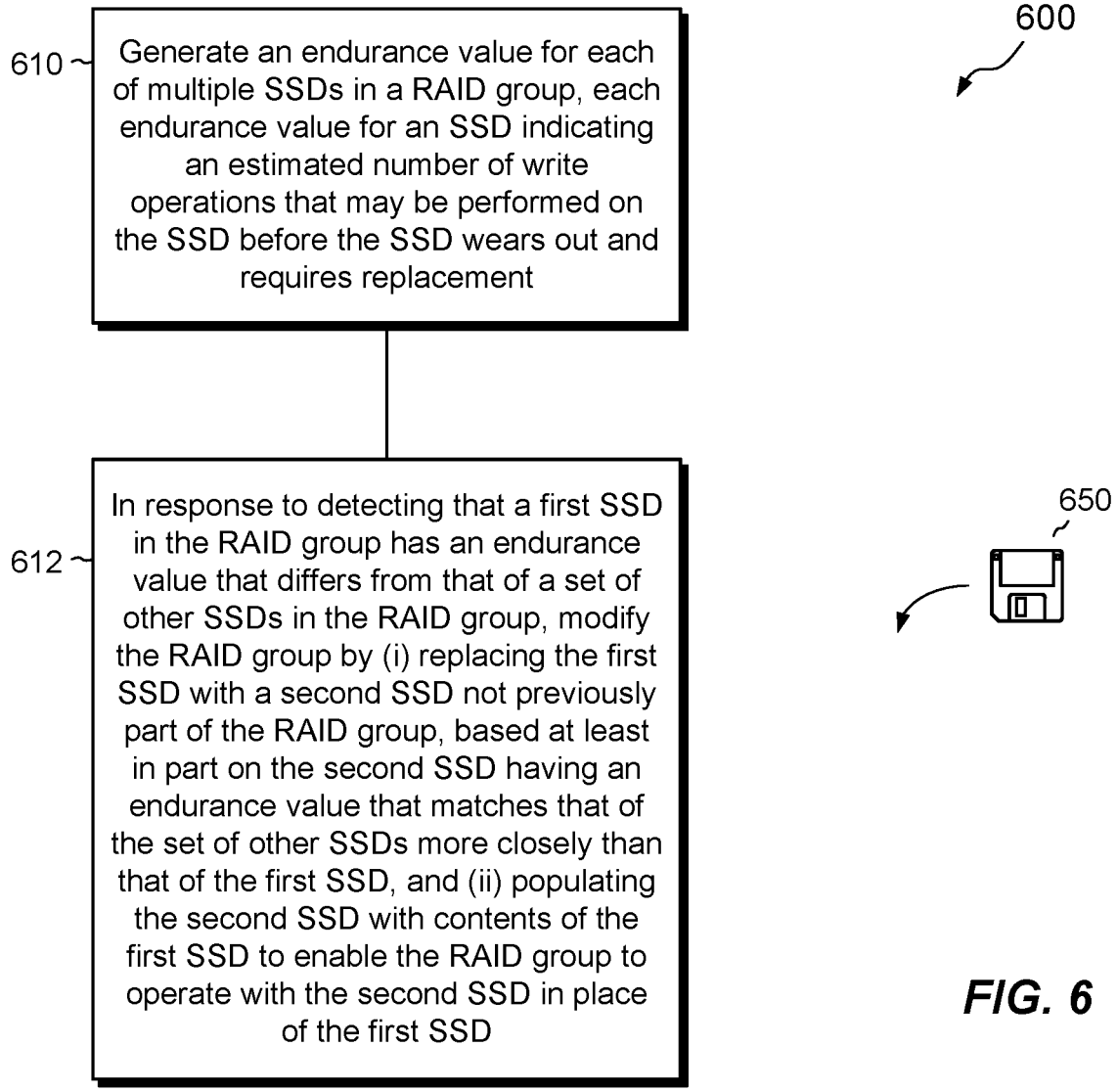
FIG. 6 is a flowchart showing an example method of managing SSDs in a data storage system.

FIG. 6 shows an example method 600 for managing SSDs in a data storage system. The method 600 may be carried out, for example, by the software constructs shown in FIG. 1, which reside in the memory 130 of SP 120 and are run by the set of processing units 124. The acts of method 600 may be ordered in any suitable way. Accordingly, embodiments may be constructed in which acts are performed in an order different from that illustrated, which may include performing some acts simultaneously.

At 610, an endurance value is generated for each of multiple SSDs in a RAID (Redundant Array of Independent Disks) group. Each endurance value for an SSD indicates an estimated number of write operations that may be performed on the SSD before the SSD wears out and requires replacement. For example, the data storage system 116 may generate endurance values 260 based on monitoring errors and/or failures in SSDs and predicting when the SSDs will need to be replaced. Endurance values 260 may also be estimated based on field data, lab testing, or in any other suitable manner.

At 620, in response to detecting that a first SSD in the RAID group has an endurance value that differs from that of a set of other SSDs in the RAID group, the RAID group is modified by (i) replacing the first SSD with a second SSD not previously part of the RAID group, based at least in part on the second SSD having an endurance value that matches that of the set of other SSDs more closely than that of the first SSD, and (ii) populating the second SSD with contents of the first SSD to enable the RAID group to operate with the second SSD in place of the first SSD. For example, as shown in FIG. 2, RAID manager 144 detects that SSD 210(4) has an endurance value (5 WPD) that differs from those of SSDs 210(1-3 and 5) (10 or 11 WPD) and replaces SSD 210(4) with SSD 250, whose endurance is 10 WPD. RAID manager 144 then populates SSD 250 with the contents of SSD 210(4), e.g., by copying or by rebuilding based on RAID protocols.

An improved technique has been described for managing SSDs in a data storage system. The technique includes generating an endurance value for each of multiple SSDs and arranging the SSDs in RAID groups based at least in part on the generated endurance values. The data storage system may then run RAID groups with higher endurance values at higher speeds and may run RAID groups with lower endurance values at lower speeds.

Having described certain embodiments, numerous alternative embodiments or variations can be made. Further, although features are shown and described with reference to particular embodiments hereof, such features may be included and hereby are included in any of the disclosed embodiments and their variants. Thus, it is understood that features disclosed in connection with any embodiment are included as variants of any other embodiment.

Further still, the improvement or portions thereof may be embodied as a computer program product including one or more non-transient, computer-readable storage media, such as a magnetic disk, magnetic tape, compact disk, DVD, optical disk, flash drive, SD (Secure Digital) chip or device, Application Specific Integrated Circuit (ASIC), Field Programmable Gate Array (FPGA), and/or the like (shown by way of example as medium 650 in FIG. 6). Any number of computer-readable media may be used. The media may be encoded with instructions which, when executed on one or more computers or other processors, perform the process or processes described herein. Such media may be considered articles of manufacture or machines, and may be transportable from one machine to another.

As used throughout this document, the words "comprising," "including," "containing," and "having" are intended to set forth certain items, steps, elements, or aspects of something in an open-ended fashion. Also, as used herein and unless a specific statement is made to the contrary, the word "set" means one or more of something. This is the case regardless of whether the phrase "set of" is followed by a singular or plural object and regardless of whether it is conjugated with a singular or plural verb. Further, although ordinal expressions, such as "first," "second," "third," and so on, may be used as adjectives herein, such ordinal expressions are used for identification purposes and, unless specifically indicated, are not intended to imply any ordering or sequence. Thus, for example, a second event may take place before or after a first event, or even if no first event ever occurs. In addition, an identification herein of a particular element, feature, or act as being a "first" such element, feature, or act should not be construed as requiring that there must also be a "second" or other such element, feature or act. Rather, the "first" item may be the only one. Although certain embodiments are disclosed herein, it is understood that these are provided by way of example only and that the invention is not limited to these particular embodiments.

Those skilled in the art will therefore understand that various changes in form and detail may be made to the embodiments disclosed herein without departing from the scope of the invention.

What is claimed is:

1. A method of managing SSDs (Solid State Drives) in a data storage system, the method comprising:
    generating an endurance value for each of multiple SSDs, each endurance value for an SSD indicating an estimated number of write operations that may be performed on the SSD before the SSD wears out and requires replacement;
    assigning SSDs to multiple RAID (Redundant Array of Independent Disks) groups based at least in part on endurance of the SSDs, such that each of the RAID groups includes SSDs of substantially similar endurance and at least two of the RAID groups include SSDs of substantially different endurance;
    in response to detecting that a first SSD in the RAID group has an endurance value that exceeds that of a set of other SSDs in the RAID group, modifying the RAID group by (i) replacing the first SSD with a second SSD not previously part of the RAID group, based at least in part on determining that the second SSD has an endurance value that matches that of the set of other SSDs more closely than that of the first SSD, and (ii) populating the second SSD with contents of the first SSD to enable the RAID group to operate with the second SSD in place of the first SSD; and
    after modifying the RAID group, varying a minimum time delay enforced between consecutive write operations to the RAID group to operate the RAID group at a slower rate of speed, based upon the second SSD having a lower endurance value than does the first SSD.

2. The method of claim 1, wherein each of the multiple SSDs in the RAID group has a manufacturer-supplied specification for endurance, and wherein generating the endurance value for at least one of the multiple SSDs in the RAID group produces an endurance value greater than the respective vendor-supplied specification for endurance.

3. The method of claim 2, wherein the second SSD is a hot spare SSD in the data storage system.

4. The method of claim 2, wherein the method further comprises:
    establishing a desired service life of the RAID group, the desired service life indicating a lifespan of the RAID group before any of its SSDs fails and requires replacement;
    generating an endurance value for the RAID group as a whole, the endurance value of the RAID group as a whole based upon a lowest endurance value of any of the SSDs in the RAID group and corresponding to a quotient of (i) a total number of writes of the entire contents of the RAID group before failure of an SSD in the RAID group is expected and (ii) the desired service life of the RAID group; and
    operating the RAID group within the data storage system at no greater on average than a number of writes per day (WPD) as indicated by the endurance value of the RAID group.

5. The method of claim 4, wherein operating the RAID group to enable the RAID group to meet the desired service life includes enforcing a minimum time delay between consecutive write operations to the RAID group to throttle write operations to the RAID group.

6. The method of claim 4, wherein the method further comprises, after operating the RAID group within the data storage system for a period of time:
    regenerating endurance values for the SSDs in the RAID group; and replacing another SSD in the RAID group based on the regenerated endurance values.

7. The method of claim 2, wherein the method further comprises:
provisioning multiple extents of storage to a data object operating in the data storage system, each extent including a set of storage elements in each of the SSDs of the RAID group;
monitoring write operations performed on at least one of the multiple extents; and
in response to the monitoring indicating that a first extent of the multiple extents has experienced a number of WPD (writes per day) that differs from the endurance of the RAID group as a whole, moving contents of the first extent to other storage media that are not part of the RAID group.

8. The method of claim 7,
wherein the data storage system includes multiple storage tiers that support respective levels of service,
wherein higher storage tiers provide faster access times than lower storage tiers;
wherein the RAID group is provided in one of the storage tiers, and wherein moving the contents of the first extent to the other storage media includes moving the contents of the first extent to a lower storage tier in response to the first extent experiencing a number of WPD that is less than the endurance of the RAID group as a whole.

9. The method of claim 7,
wherein the data storage system includes multiple storage tiers that support respective levels of service,
wherein higher storage tiers provide faster access times than lower storage tiers;
wherein the RAID group is provided in one of the storage tiers, and wherein moving the contents of the first extent to the other storage media includes moving the contents of the first extent to a higher storage tier in response to the first extent experiencing a number of WPD that is greater than the endurance of the RAID group as a whole.

10. The method of claim 7, wherein a second extent provisioned to the data object includes multiple sub-extents, and wherein the method further comprises:
monitoring write operations performed on each sub-extent of the second extent; and
in response to the monitoring indicating that a sub-extent within the second extent has experienced a number of WPD that differs from the endurance of the RAID group as a whole, moving contents of the sub-extent to other storage media that are not part of the RAID group.

11. The method of claim 2, wherein generating the endurance value for each of the multiple SSDs in the RAID group includes, for each SSD:
monitoring, as the SSD operates in the data storage system, a number of failures that have occurred in the SSD and a corresponding number of P/E (Program/Erase) cycles performed by the SSD when that number of failures occurred; and
predicting, based on the number of failures, an expected number of P/E cycles at which the SSD will require replacement.

12. The method of claim 11, wherein predicting the expected number of P/E cycles at which the SSD will require replacement includes:

providing a characteristic failure curve for SSDs, the characteristic failure curve relating numbers of chip failures to number of P/E cycles;
fitting the characteristic failure curve to the monitored number of failures and corresponding number of P/E cycles; and
extrapolating along the fitted curve to identify a number of P/E cycles at which the curve crosses an error threshold, the error threshold representing a level of errors at which the SSD should be replaced.

13. A data storage system, comprising control circuitry that includes a set of processing units coupled to memory, the control circuitry constructed and arranged to:
generate an endurance value for each of multiple SSDs, each endurance value for an SSD indicating an estimated number of write operations that may be performed on the SSD before the SSD wears out and requires replacement;
assign SSDs to multiple RAID (Redundant Array of Independent Disks) groups based at least in part on endurance of the SSDs, such that each of the RAID groups includes SSDs of substantially similar endurance and at least two of the RAID groups include SSDs of substantially different endurance;
in response to detecting that a first SSD in the RAID group has an endurance value that exceeds that of a set of other SSDs in the RAID group, modify the RAID group by (i) replacing the first SSD with a second SSD not previously part of the RAID group, based at least in part on determining that the second SSD has an endurance value that matches that of the set of other SSDs more closely than that of the first SSD, and (ii) populating the second SSD with contents of the first SSD to enable the RAID group to operate with the second SSD in place of the first SSD; and
after modifying the RAID group, varying a minimum time delay enforced between consecutive write operations to the RAID group to operate the RAID group at a slower rate of speed upon the second SSD having a lower endurance value than does the first SSD.

14. The data storage system of claim 13, wherein the control circuitry is further constructed and arranged to:
provision multiple extents of storage to a data object operating in the data storage system, each extent including a set of storage elements in each of the SSDs of the RAID group;
monitor write operations performed on at least one of the multiple extents; and
in response to monitoring indicating that a first extent of the multiple extents has experienced a number of WPD (writes per day) that differs from the endurance of the RAID group as a whole, move contents of the first extent to other storage media that are not part of the RAID group.

15. A computer program product including a set of non-transitory, computer-readable media having instructions which, when executed by control circuitry of a data storage system, cause the control circuitry to perform a method for managing SSDs (Solid State Drives), the method comprising:
generating an endurance value for each of multiple SSDs, each endurance value for an SSD indicating an estimated number of write operations that may be performed on the SSD before the SSD wears out and requires replacement;
assigning SSDs to multiple RAID (Redundant Array of Independent Disks) groups based at least in part on endurance of the SSDs, such that each of the RAID groups includes SSDs of substantially similar endurance and at least two of the RAID groups include SSDs of substantially different endurance;

in response to detecting that a first SSD in the RAID group has an endurance value that exceeds that of a set of other SSDs in the RAID group, modifying the RAID group by (i) replacing the first SSD with a second SSD not previously part of the RAID group, based at least in part on determining that the second SSD has an endurance value that matches that of the set of other SSDs more closely than that of the first SSD, and (ii) populating the second SSD with contents of the first SSD to enable the RAID group to operate with the second SSD in place of the first SSD; and after modifying the RAID group, varying a minimum time delay enforced between consecutive write operations to the RAID group to operate the RAID group at a slower rate of speed, based upon the second SSD having a lower endurance value, than does the first SSD.

16. The computer program product of claim 15, wherein each of the multiple SSDs in the RAID group has a manufacturer-supplied specification for endurance, and wherein generating the endurance value for at least one of the multiple SSDs in the RAID group produces an endurance value greater than the respective vendor-supplied specification for endurance.

17. The computer program product of claim 15, wherein the method further comprises:

establishing a desired service life of the RAID group, the desired service life indicating a lifespan of the RAID group before any of its SSDs fails and requires replacement;

generating an endurance value for the RAID group as a whole, the endurance value of the RAID group as a whole based upon a lowest endurance value of any of the SSDs in the RAID group and corresponding to a quotient of (i) a total number of writes of the entire contents of the RAID group before failure of an SSD in the RAID group is expected and (ii) the desired service life of the RAID group; and operating the RAID group within the data storage system at no greater on average than a number of writes per day (WPD) as indicated by the endurance value of the RAID group.

18. The computer program product of claim 15, wherein the method further comprises:

provisioning multiple extents of storage to a data object operating in the data storage system, each extent including a set of storage elements in each of the SSDs of the RAID group;

monitoring write operations performed on at least one of the multiple extents; and in response to the monitoring indicating that a first extent of the multiple extents has experienced a number of WPD (writes per day) that differs from the endurance of the RAID group as a whole, moving contents of the first extent to other storage media that are not part of the RAID group.

19. The computer program product of claim 18, wherein the data storage system includes multiple storage tiers that support respective levels of service, wherein higher storage tiers provide faster access times than lower storage tiers;

wherein the RAID group is provided in one of the storage tiers, and wherein moving the contents of the first extent to the other storage media includes moving the contents of the first extent to a lower storage tier in response to the first extent experiencing a number of WPD that is less than the endurance of the RAID group as a whole.

20. The computer program product of claim 18, wherein a second extent provisioned to the data object includes multiple sub-extents, and wherein the method further comprises:

monitoring write operations performed on each sub-extent of the second extent; and in response to the monitoring indicating that a sub-extent within the second extent has experienced a number of WPD that differs from the endurance of the RAID group as a whole, moving contents of the sub-extent to other storage media that are not part of the RAID group.

21. The method of claim 1, further comprising performing storage tiering among multiple storage tiers of the data storage system based at least in part on numbers of writes per day (WPD) experienced by storage extents in the storage tiers.

22. The method of claim 21, further comprising performing storage tiering based on a score derived as a weighted sum of data temperature and write frequency.

23. The method of claim 1, further comprising swapping one or more SSDs between or among RAID groups to better balance endurance values of SSDs within each affected RAID group.

24. The method of claim 12, wherein the characteristic failure curve has a linear region, and wherein fitting the characteristic failure curve to the monitored number of failures and corresponding number of P/E cycles includes estimating a slope of the linear region for a particular SSD type and predicting the number of P/E cycles at which the characteristic failure curve crosses the error threshold.

25. The method of claim 1, wherein generating the endurance value for each of the multiple SSDs includes estimating the endurance based on laboratory analysis and characterization of makes, models, and/or manufacturing runs of the SSDs.

* * * * *